United States Patent
Takago et al.

Patent Number: 5,288,829
Date of Patent: Feb. 22, 1994

[54] CURABLE SILICONE COMPOSITION

[75] Inventors: Toshio Takago; Horishi Inomata; Shinichi Sato, all of Annaka; Noriyuki Koike, Yoshii; Takashi Matsuda; Hirofumi Kishita, both of Annaka, all of Japan

[73] Assignee: Shin-Etsu Chemical Co., Ltd., Tokyo, Japan

[21] Appl. No.: 917,291

[22] Filed: Jul. 23, 1992

[30] Foreign Application Priority Data

Jul. 23, 1991 [JP] Japan ................. 3-206590
Sep. 10, 1991 [JP] Japan ................. 3-258601
Sep. 10, 1991 [JP] Japan ................. 3-258602

[51] Int. Cl.$^5$ ................. C08G 77/04
[52] U.S. Cl. ................. 528/15; 528/31; 528/32; 528/42
[58] Field of Search ................. 528/15, 31, 32, 42

[56] References Cited

U.S. PATENT DOCUMENTS

| | | | |
|---|---|---|---|
| 3,542,830 | 11/1970 | Kim et al. | 528/42 |
| 3,627,801 | 12/1971 | Pierce et al. | 528/42 |
| 3,647,740 | 3/1972 | Loree et al. | 528/42 |
| 3,818,064 | 6/1974 | Kim | 528/42 |
| 4,100,136 | 7/1978 | Carter et al. | 528/42 |
| 5,120,810 | 6/1992 | Fujiki | 528/15 |

FOREIGN PATENT DOCUMENTS

| | | |
|---|---|---|
| 0311262 | 4/1989 | European Pat. Off. |
| 2337731 | 8/1977 | France |

*Primary Examiner*—Ralph H. Dean
*Attorney, Agent, or Firm*—Oblon, Spivak, McClelland, Maier & Neustadt

[57] ABSTRACT

A curable silicone composition, comprising (A) a fluorosilicone represented by the following general formula (1):

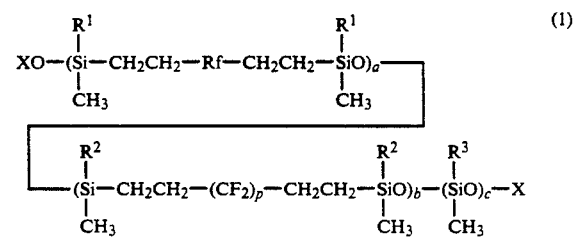

wherein Rf represents a perfluoroalkylene group or perfluoropolyether group having 11 to 30 carbon atoms, $R^1$, $R^2$, and $R^3$ each represent a monovalent hydrocarbon group, a and p are each an integer of 2 or over, b and c are each an integer of 0 or over, and X is a triorganosilyl group, (B) an organohydrogensiloxane containing two or more Si—H groups in the molecule, and (C) a platinum family metal catalyst. This composition upon curing gives a rubberlike elastic product excellent in solvent resistance, chemical resistance, water repellency, and oil repellency and low in moisture permeability.

6 Claims, 1 Drawing Sheet

CURABLE SILICONE COMPOSITION

BACKGROUND OF THE INVENTION

1. Field of the Invention

The present invention relates to a curable silicone composition capable of forming a cured product excellent in solvent resistance, water repellency, and oil repellency.

2. Description of the Prior Art

Curable silicone compositions are used in various fields since they can form rubberlike elastic cured products excellent in properties such as heat resistance. Such a curable silicone composition is disclosed, for example, in U.S. Pat. No. 4,100,136, i.e., the U.S. Patent discloses a curable composition, consisting essentially of a homogeneous mixture of (A) a siloxane polymer or copolymer of the formula

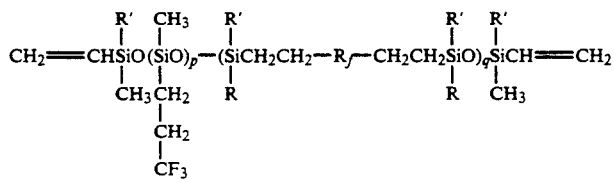

(B) a curing agent of the formula

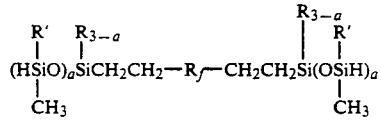

(C) an effective amount of a platinum-containing catalyst; where, in (A) and (B), each R and R' is independently methyl, phenyl, or 3,3,3-trifluoropropyl, each $R_f$ is independently a perfluoroalkylene radical of 2 to 10 carbon atoms, a perfluorocycloalkylene radical, or a perfluoroalkylene radical of 2 to 10 carbon atoms or a perfluorocycloalkylene radical containing one or more —C—O—C— linkages; p has a value of 0 to 2 q inclusive, so that, when p=0, siloxane (A) is a siloxane polymer, but when p has a value of from greater than 0 to q, inclusive, siloxane (A) can be either a random copolymer or an alternating copolymer and when p has a value of from greater than q to 2 q, inclusive, siloxane (A) is only an alternating copolymer having no more than 2 adjacent $CH_3$ ($CF_3CH_2CH_2$) SiO units, q has an average value of at least 3, each a is independently 1,2 or 3, there being an average of greater than 2.0 silicone-bonded hydrogen atoms per molecule of (B) and the amount of (B) being such that there is, in said curable composition, from 0.5 to 3.0 silicone-bonded hydrogen atoms for every silicone-bonded vinyl radical.

SUMMARY OF THE INVENTION

An object of the present invention is to provide a curable silicone composition capable of forming a cured product excellent in solvent resistance, water repellency, and oil repellency.

According to the present invention, there is provided a curable silicone composition, comprising (A) a fluorocarbonsiloxane represented by the following general formula (1):

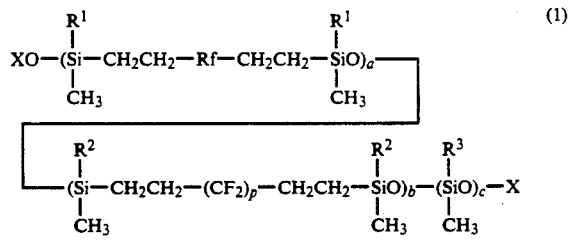

wherein $R^1$ and $R^2$ each represent an unsubstituted or substituted monovalent hydrocarbon group, $R^3$ represents a monovalent hydrocarbon group having 1 to 8 carbon atoms, Rf represents a bivalent perfluoroalkylene group or a bivalent perfluoropolyether group represented by the following general formula:

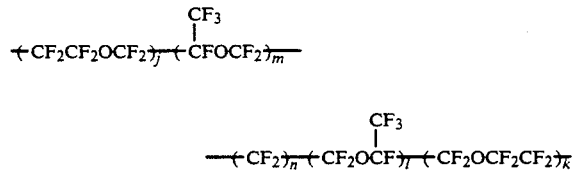

wherein n is an integer of 0 to 8, m and l are each an integer of 0 to 5, and j and k are each an integer of 0 or 1, provided that $l+m+n+j+k$ is an integer bringing the number of carbon atoms to 11 to 30, a is an integer of 2 to 300, b is an integer of 0 to 300, c is an integer of 0 to 5,000, p is an integer of 2 to 8, and X is a triorganosilyl group represented by the following formula:

wherein $R^4$ is an unsubstituted or substituted monovalent hydrocarbon group having an aliphatic unsaturated bond, and $R^5$ and $R^6$ each represent a monovalent hydrocarbon group having 1 to 8 carbon atoms, (B) an organohydrogensiloxane containing two or more Si—H groups in the molecule, and (C) a platinum family metal catalyst, the amount of the component (B) being such that the amount of the Si—H groups is 0.5 to 5.0 mol per mol of the aliphatic unsaturated group in the composition.

The present invention has succeeded in attaining the above object by using as a base polymer a polysiloxane having a long-chain bivalent fluorine-containing group having 11 to 30 carbon atoms (the above component (A)). The present composition upon curing forms a rubberlike elastic product excellent in solvent resistance, chemical resistance, water repellency, and oil repellency, and low in moisture permeability. The composition is also excellent in workability, and in particular where the component (A) of the composition has a viscosity of 100,000 cSt or less (at 25° C.), the composition is useful as a liquid rubber material for gaskets by FIPG machines.

DETAILED DESCRIPTION OF THE INVENTION

(a) Fluorocarbonsiloxanes

Figure 1:
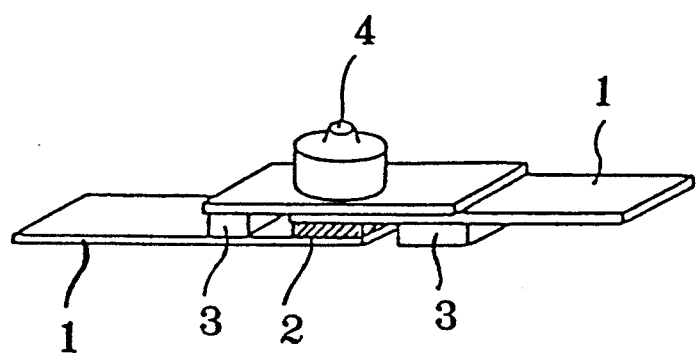
FIG. 1 is a diagram showing a sample used for the measurement of the adhesive strength under shear in Examples.

In the general formula (I), examples of the substituted or unsubstituted hydrocarbon group represented by $R^1$ and $R^2$ include an alkyl group such as a methyl group, an ethyl group, a propyl group, a butyl group, a 2-ethylbutyl group, and an octyl group, a cycloalkyl group such as a cyclohexyl group and a cyclopentyl group, an aryl group such as a phenyl group, a tolyl group, a xylyl group, a naphthyl group, and a diphenyl group, an aralkyl group such as a benzyl group and a phenylethyl group, and corresponding substituted hydrocarbon groups wherein part or all of the hydrogen atoms of the above monovalent hydrocarbon groups have been replaced with a halogen atom(s), a cyano group(s), or the like such as a chloromethyl group, a trifluoropropyl group, a 2-cyanoethyl group, a 3-cyanopropyl group, and $-C_2H_4CF(CF_3)_2$. Out of these hydrocarbon groups, preferable ones are unsubstituted or fluorine-substituted alkyl groups having up to 6 carbon atoms, and $-C_2H_4CF(CF_3)_2$ and a methyl group are the most preferable. The substituted or unsubstituted monovalent hydrocarbon group $R^4$ having an aliphatic unsaturated group in the terminal organosilyl group X includes, for example, a vinyl group, an allyl group, and a hexenyl group, and the monovalent hydrocarbon groups $R^3$, $R^5$, and $R^6$ having 1 to 8 carbon atoms include, for example, an alkyl group such as a methyl group, an ethyl group, a propyl group, a butyl group, a 2-ethylbutyl group, and an octyl group, a cycloalkyl group such as a cyclohexyl group and a cyclopentyl group, an alkenyl group such as a vinyl group, an ally group, and a hexenyl group, an aryl group such as a phenyl group, a tolyl group, and a xylyl group, an aralkyl group such as a benzyl group and a phenylethyl group, and corresponding substituted hydrocarbon groups wherein part or all of the hydrogen atoms of the above monovalent hydrocarbon groups have been replaced with a halogen atom(s), a cyano group(s), or the like such as a chloromethyl group, a trifluoropropyl group, a 2-cyanoethyl group, a 3-cyanopropyl group, and $-C_2H_4CF(CF_3)_2$. Out of these hydrocarbon groups, preferable ones are unsubstituted or fluorine-substituted alkyl groups having up to 6 carbon atoms, and $-C_2H_4CF(CF_3)_2$ and a methyl group are the most preferable.

Typical examples of the bivalent perfluoroalkylene group or perfluoropolyether group Rf include

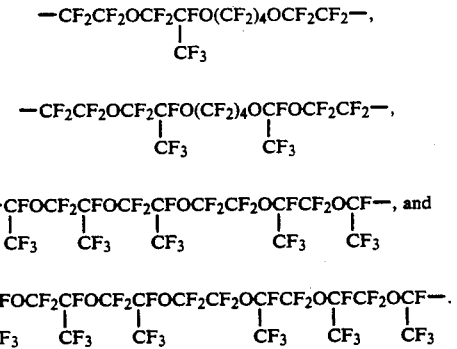

In the present invention, it is possible to use, as the polymer (A), polymers which range from a polymer having a low viscosity of tens cSt (25° C.) to a solid gumlike polymer. In view of the easy handling, for example, a gumlike polymer is suitable for heat-curable rubbers and a polymer having a viscosity of about 100 to 100,000 cSt (25° C.) is suitable for liquid rubbers. If the viscosity is too low, the elongation of the obtainable cured product as an elastomer becomes small and balanced physical properties cannot be obtained.

The preparation of the polymer (A) wherein in the general formula (1) b and c are each 0 can be carried out, for example, through the following synthetic route:

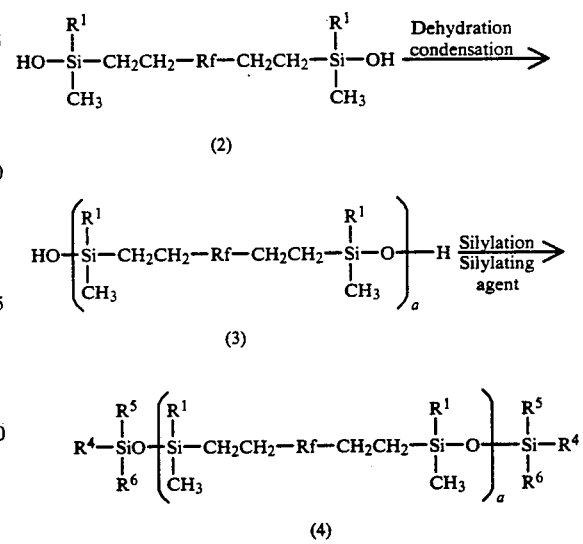

wherein $R^1$, $R^2$, $R^3$, $R^4$, $R^5$, $R^6$, Rf, and a have the same meanings as defined above.

Where b or c is not 0 in the general formula (A), it is recommended to carry out dehydration condensation of diols corresponding to the structural units indicated by b or c, i.e.,

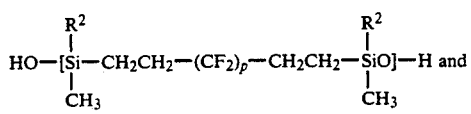

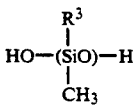

wherein $R^2$, $R^3$, and p have the same meanings as defined above, at the same time when the disilanol of the formula (2) is subjected to dehydration condensation in the above synthesis course.

In the above synthesis course, after the diol represented by the formula (3) is obtained, the diol is silylated to introduce the silyl group represented by X at the terminal thereby obtaining the fluorocarbonsiloxane (A). The silylating agent to be used includes, for example, a silane compound represented by the formula:

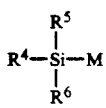

wherein $R^4$, $R^5$, and $R^6$ have the same meanings as defined above, M represents a halogen atom such as chlorine, bromine, and iodine,

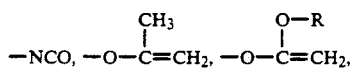

or $-CH_2COOR$ wherein R represents a monovalent hydrocarbon group having 1 to 10 carbon atoms and a disilazane compound represented by the formula:

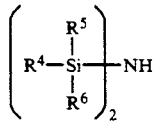

wherein $R^4$, $R^5$, and $R^6$ have the same meanings as defined above. Out of these, preferable ones are, for example,

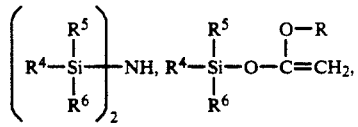

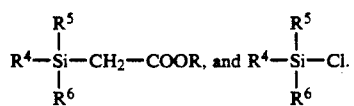

$R^4$, $R^5$, and $R^6$ of these silylating agents may be selected to correspond to the terminal group X of the intended fluorocarbonsiloxane (A).

Typical examples of the terminal group X include

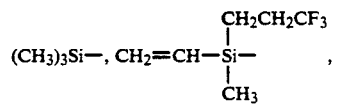

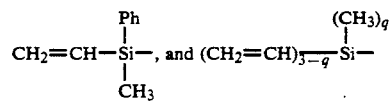

wherein q is 0, 1, or 2, and Ph represents a phenyl group.

Typical examples of the fluorocarbonsiloxane, the component (A), synthesized as described above include

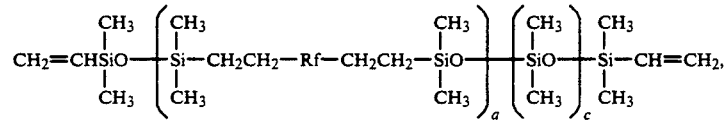

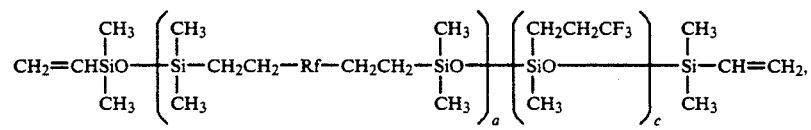

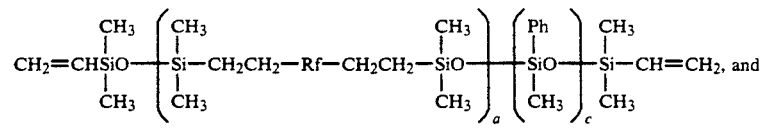

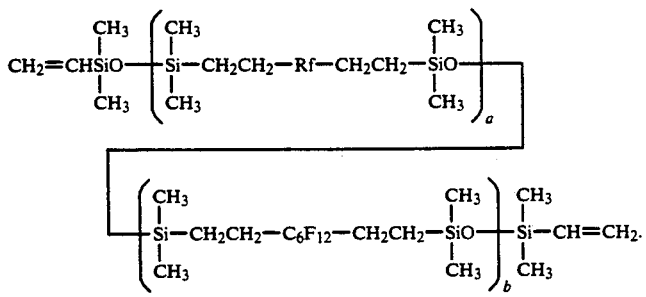

The fluorocarbonsiloxane (A) has, as essential structural units, fluorocarbonsiloxane units wherein two silicon atoms are connected through —$CH_2CH_2$—$Rf$—$CH_2CH_2$— and desirably the fluorocarbonsiloxane units amount to 50 mol % or more, preferably 80 mol %, in the all siloxane units. If the content of the fluorocarbonsiloxane unit is small, the obtained cured product tends to become lower in solvent resistance and chemical resistance. Further, in the fluorocarbonsiloxane (A), the content of the aliphatic unsaturated group which will contribute to the crosslinking is preferably 0.3 mol or less, more preferably 0.1 mol or less, per 100 g. If the amount of the aliphatic unsaturated group is excessive, the crosslink density will increase and as a result the obtainable cured product is apt to lack elongation.

(B) Organohydrogensiloxanes

The component (B) functions as a crosslinking agent and can be used without any particular restriction if there are two or more hydrogen atoms bonded to silicon atoms in the molecule, and the component (B) may be any of straight chain, branched chain, and cyclic chain organohydrogensiloxanes. Examples include

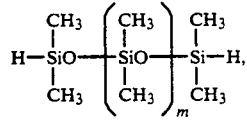

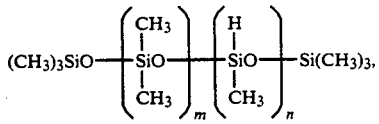

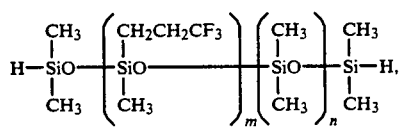

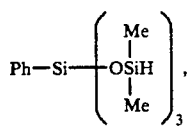

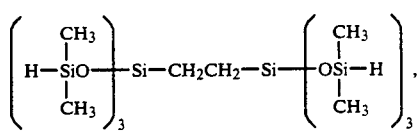

-continued

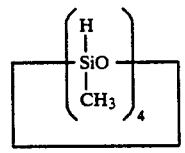

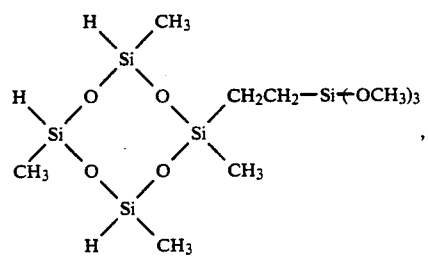

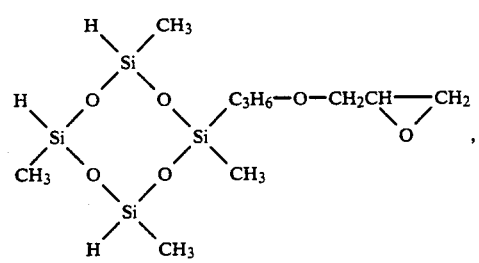

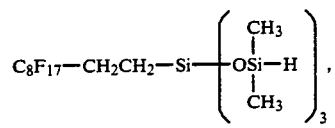

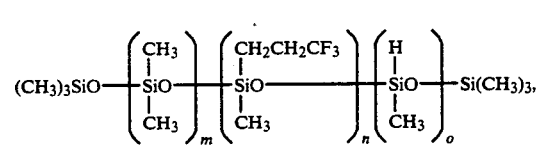

and

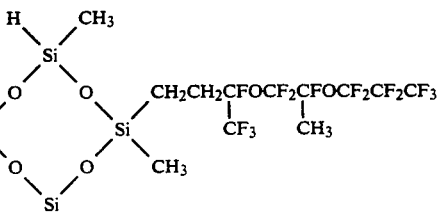

wherein m, n, and o are each a positive integer.

Such an organohydrogensiloxane can be prepared, for example, by subjecting

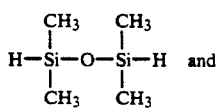 and

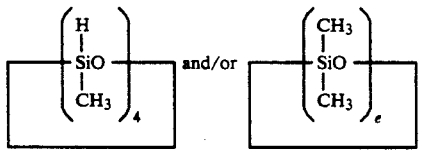

wherein e is an integer of 3 to 8 to an equilibration reaction using an acid catalyst such as sulfuric acid, or by a co-hydrolysis reaction of silanes or siloxanes having hydrolyzable atoms or groups (e.g., chlorine atoms and alkoxyl groups) corresponding to the intended molecular structure.

Further, where the organohydrogensiloxane has a special functional group, it can be prepared, for example, by a partial addition reaction as described, for example, in Japanese Patent Publication (kokoku) No. 51-33540 (1986).

The above exemplified organohydrogensiloxanes may have a low molecular weight or a high molecular weight, but in view of the readiness of the preparation, the organohydrogensiloxane is preferably one having a relatively low molecular weight of up to 30,000.

Further, in the present invention, besides the above organohydrogensiloxanes, fluorine-containing organohydrogensiloxanes represented by the following general formula (5):

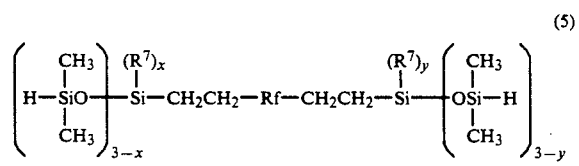 (5)

wherein Rf has the same meaning as defined above, $R^7$ represents a monovalent hydrocarbon group having 1 to 8 carbon atoms, and x and y are each an integer of 0 to 2 can preferably be used. Since this fluorine-containing organohydrogensiloxane contains the fluorine-containing organic group Rf common to the component (A), the fluorine-containing organohydrogensiloxane advantageously exhibits a good compatibility with the component (A) and also contributes to the improvement of the solvent resistance and the chemical resistance of the cured product.

In the above formula (5), the hydrocarbon group $R^7$ having 1 to 8 carbon atoms includes those groups exemplified for $R^5$ and $R^6$ above. Typical examples of the fluorine-containing organohydrogensiloxane represented by the general formula (5) include

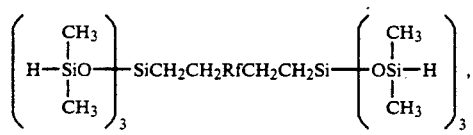

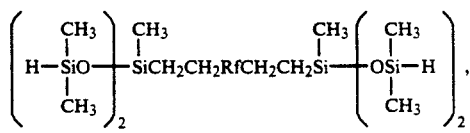

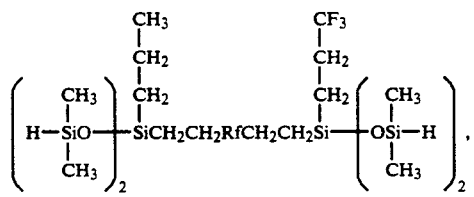

and

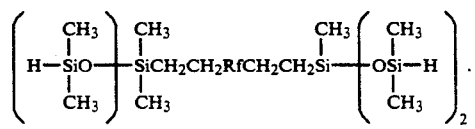

The fluorine-containing organohydrogensiloxane can be prepared by reacting a diethylene compound represented by the following formula:

$$CH_2=CH-Rf-CH=CH_2$$

wherein Rf has the same meaning as defined above with a chlorosilane compound represented by the following formula:

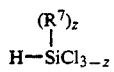

wherein z is an integer of 0 to 2, in the presence of a catalyst such as platinum to synthesize a compound represented by the following formula:

wherein $R^7$, Rf, x, and y have the same meaning as defined above, and then co-hydrolyzing the thus synthesized compound together with 1,1,3,3-tetramethyldisiloxane in an aqueous hydrochloric acid solution.

Although it is enough if the amount of the component (B) to be added is 0.1 to 50 parts by weight per 100 parts by weight of the major component (A), practically the amount of the component (B) is such that the 0.5 to 5 mol, desirably 1.2 to 3.0 mol of the Si—H group is supplied for 1 mol of the aliphatic unsaturated group such as a vinyl group, an allyl group, and a cycloalkenyl group containing in the whole composition. If the amount of the component (B) is too small, the degree of crosslinking becomes unsatisfactory, whereas if the amount is too much, foaming will take place or the heat resistance, the compression set proprieties, etc. will be deteriorated. Further, it is desirable to use, as this crosslinking agent, one which is compatible with the component (A) as far as possible, because, in that case, a uniform cured product will be obtained.

(C) Platinum family metal catalysts

The platinum family metal catalyst is a catalyst for promoting the addition reaction (hydrosilylation) between the component (A) and the component (B). Examples include platinum catalysts, ruthenium catalysts, iridium catalysts, and palladium catalysts.

Since generally these are compounds of noble metals and therefore expensive, a relatively readily available platinum catalyst is often used. The platinum catalyst includes, for example, chloroplatinic acid, a complex of chloroplatinic acid with an olefin such as ethylene, a complex of chloroplatinic acid with an alcohol or a vinyl siloxane, and a solid catalyst having platinum carried on a carrier such as alumina or carbon. In order to obtain a more uniform cured product, desirably a solution of chloroplatinic acid or its complex dissolved in a suitable solvent is used to be compatibilized with the component (A).

Besides the platinum catalysts, examples include $RhCl(P\phi_3)_3$, $RhCl(CO)(P\phi_3)_2$, $RhCl(C_2H_4)_2$, $Ru_3(CO)_{12}$, $IrCl(CO)(P\phi_3)_2$, and $Pd(P\phi_3)_4$ wherein $\phi$ represents phenyl.

Although there is no particular restriction on the amount of these catalysts to be used, because they are expensive, generally the amount of the catalyst to be used may be 1 to 1,000 ppm, desirably on the order of 10 to 500 ppm.

Other ingredients

Further, in the present invention, in addition to the above-mentioned components (A) to (C), an epoxy group containing siloxane represented by the following general formula (6):

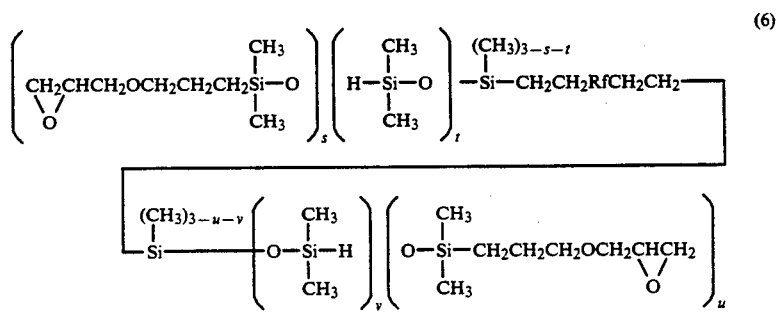

(6)

wherein Rf has the same meaning as defined above and s and u are each an integer which satisfies that $0 \leq s \leq 3$, $0 \leq u \leq 3$, and $s+u \geq 1$, and t and v are each an integer which satisfies that $1 \leq t \leq 3$ and $1 \leq v \leq 3$ can be blended. This epoxy group containing siloxane acts particularly as an adhesion assistant and improves the adhesion of the cured product to various bases. Typical examples of this epoxy group containing siloxane include

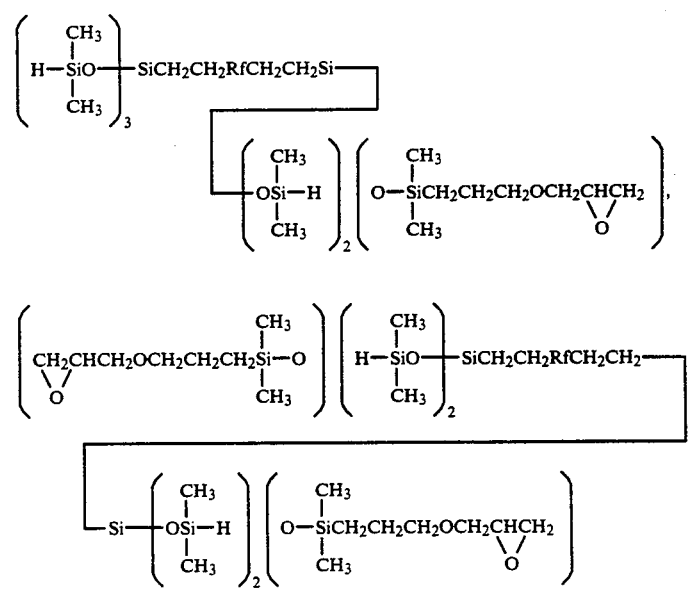

and

-continued

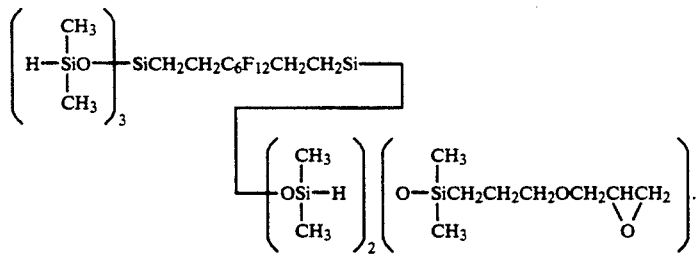

The amount of this epoxy group containing siloxane to be blended is preferably in the range of 0.1 to 50 parts by weight per 100 parts by weight of the component (A), in which range desirable adhesion can be exhibited. Additionally stating, since this epoxy group containing siloxane contains Si—H groups in the molecule, it also acts as a crosslinking agent. Therefore, where this epoxy group containing siloxane is used, it is desirable to control the amount of the epoxy group containing siloxane to be blended so that the total amount of the Si—H groups in the composition may be 5 mol or less, particularly 3.0 mol or less, for 1 mol of the aliphatic unsaturated group contained in the composition.

Further, in the present invention, if necessary, various additives can be added further. Specifically, for example, there are an organopolysiloxane having a resin structure which comprises $SiO_2$ units, $CH_2=CH(R_2)SiO_{0.5}$ units, and $R_3SiO_{0.5}$ units (wherein R represents a monovalent hydrocarbon group not containing an aliphatic unsaturated double bond) (see Japanese Patent Publication (kokoku) Nos. 38-26771 (1963) and 45-9476 (1970)), which will be added in order to reinforce the strength of the obtainable cured product which is an elastic product, and a polysiloxane containing $CH_2=CHR^5SiO$ units (wherein $R^5$ has the same meaning as defined above) (see Japanese Patent Publication (kokoku) No. 48-10947 (1973)) and an acetylene compound (see U.S. Patent Specification No. 3,445,420 and Japanese Patent Publication (kokoku) No. 54-3774 (1974) as well as an ionic compound of a heavy metal (see U.S. patent specification Ser. No. 3,532,649), which will be added in order to control the curing rate of the composition. Further, a suitable amount of a nonfunctional organopolysiloxane may of course be added in order to improve, for example, the thermal shock resistance and the flexibility.

Further, to the present composition, a filler may be added in order to reduce the thermal shrinkage at the time of the curing, to lower the thermal expansion coefficient of the elastic product that will be obtained by curing the composition, to improve the heat stability, the weathering resistant, the chemical resistance, the fire retardancy, or the mechanical strength of the elastic product, or to lower the gas permeability of the elastic product. The filler includes, for example, fumed silica, quarts powder, glass fiber, carbon, a metal oxide such as iron oxide, titanium oxide, and selenium oxide, and a metal carbonate such as calcium carbonate and magnesium carbonate. Further, if necessary, a suitable pigment, a dye, or an antioxidant may be added.

To put the present composition to be practically used, the present composition may be dissolved in a suitable organic solvent such as benzotrichloride and metaxylene hexafluoride to obtain a desired strength, depending on the application and the purpose.

Uses and Method of the Use

The present composition can be cured at room temperature and also can be cured at 100° to 200° C. within a short period of time from several hours to several minutes.

Since the present composition gives a rubberlike product excellent in solvent resistance, water repellency, and oil repellency, the present composition is useful particularly in the field, for example, of liquid rubber materials for gaskets by FIPG machines, sealants, molded items, extruded items, and coverings.

EXAMPLES

Now the present invention will specifically be described on the basis of Examples, wherein the viscosity is the value measured at 25° C.

EXAMPLE 1

15 parts by weight of fumed silica treated with trimethylsiloxy groups was added to 100 parts by weight of a fluorocarbonsiloxane polymer (having a viscosity of 5,700 cSt, an average molecular weight of 2,500, and a vinyl group content of 0.008 mol/100 g) represented by the following formula:

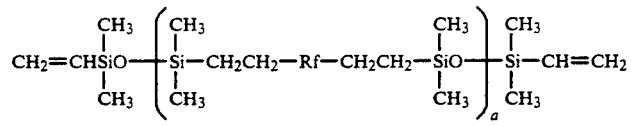

wherein Rf represents

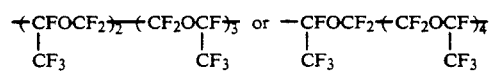

and a is about 25 on average, then after they were mixed and heat-treated, they were mixed on a three-roll mill, and then 2.7 parts by weight of a methylhydrogenpolysiloxane (having a viscosity of 11 cSt) represented by the following formula:

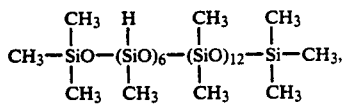

0.47 part by weight of carbon black, a toluene solution of a catalyst obtained by modifying chloroplatinic acid with CH$_2$=CH—Si(CH$_3$)$_2$—O—Si(CH$_3$)$_2$—CH=CH$_2$ (the concentration of platinum: 1.0 wt. %), and 0.002 part by weight of 2-ethynylisopropanol were added thereto, followed by mixing. The resulting mixture was deaerated under reduced pressure, was then placed in a rectangular clamping frame, was deaerated again, and was press cured at 120 kgf/cm$^2$ and 150° C. for 20 min. Test specimens were cut out from the cured sample and the physical properties were measured in accordance with JIS K 6301, which gave the following results:

| Hardness (JIS-A*): | 48 |
|---|---|
| Elongation (%): | 310 |
| Tensile strength (kgf/cm$^2$): | 49 |

(*Note: the hardness was measured by using an a-type spring hardness tester stipulated in JIS K 6301.)

EXAMPLE 2

Example 1 was repeated, except that, in place of the fluorocarbonsiloxane polymer used in Example, 100 parts by weight of a fluorocarbonsiloxane polymer (having a viscosity of 6,300 cSt, an average molecular weight of 28,000, and a vinyl group content of 0.007 mol/100 g) represented by the following formula:

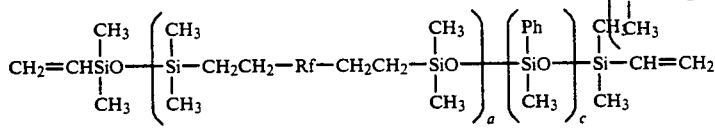

wherein Rf represents

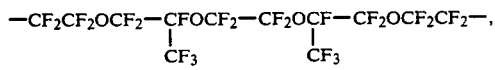

a is about 32 on the average, c is about 8 on the average, and the constitutional units are arranged at random was used, thereby preparing a composition, from which a cured sheet was prepared. Test specimens were cut out from the cured sheet and the physical properties were measured in accordance with JIS K 6301, which gave the following results:

| Hardness (JIS-A*): | 52 |
|---|---|
| Elongation (%): | 330 |
| Tensile strength (kgf/cm$^2$): | 55 |

EXAMPLE 3

Example 1 was repeated, except that, in place of the methylhydrogenpolysiloxane used in Example 1, 0.90 part by weight of a methylhydrogencyclosiloxane represented by the following formula:

$$\left[ \begin{array}{c} H \\ | \\ SiO \\ | \\ CH_3 \end{array} \right]_4$$

was used, thereby preparing a cured sheet. Test specimens were cut out from the cured sheet and the physical properties were measured in accordance with JIS K 6301.

| Hardness (JIS-A*): | 45 |
|---|---|
| Elongation (%): | 290 |
| Tensile strength (kgf/cm$^2$): | 45 |

EXAMPLE 4

Example 1 was repeated, except that, in place of the fluorocarbonsiloxane polymer used in Example 1, 100 parts by weight of a fluorocarbonsiloxane polymer (having a viscosity of 6,100 cSt, an average molecular weight of 27,000, and a vinyl group content of 0.007 mol/100 g) represented by the following formula:

$$CH_2=CHSiO\begin{pmatrix} CH_3 \\ | \\ Si-CH_2CH_2-Rf'-CH_2CH_2-SiO \\ | \\ CH_3 \end{pmatrix}_a$$
$$\begin{pmatrix} CH_3 \\ | \\ Si-CH_2CH_2-C_6F_{12}-CH_2CH_2-SiO \\ | \\ CH_3 \end{pmatrix}_c \begin{array}{c} CH_3 \\ | \\ Si-CH=CH_2 \\ | \\ CH_3 \end{array}$$

wherein Rf' represents

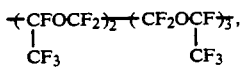

a is about 24 on average, c is about 6 on average, and the constitutional units are arranged at random was used and the amount of the methylhydrogenpolysiloxane to be blended was changed to 2.5 parts by weight, thereby preparing a cured sheet. Test specimens were cut out from the sheet and the physical properties were measured in accordance with JIS K 6301.

| Hardness (JIS-A*): | 52 |
|---|---|
| Elongation (%): | 260 |
| Tensile strength (kgf/cm$^2$): | 58 |

With respect to the elastomers obtained in Examples 1 to 4, the chemical resistance, the solvent resistance, and the surface properties were tested and the results are shown below.

Further, for the sake of comparison, the chemical resistance of a silicone rubber and the solvent resistance and the surface properties of the composition (iii) shown in Japanese Patent Publication (kokoku) No. 58-56582 (1983) were tested and the results are also shown below.

TABLE 1

| | Volume change ΔV (%) | | | | |
|---|---|---|---|---|---|
| | Example 1 | Example 2 | Example 3 | Example 4 | Silicone rubber |
| 10% aqueous NaOH solution | 0 | 0 | 0 | 0 | 0 |
| 10% aqueous HCl solution | 0 | 0 | 0 | 0 | 2 |
| 10% aqueous HNO$_3$ solution | 0 | 2 | 0 | 0 | 8 |
| 10% aqueous H$_2$SO$_4$ solution | 0 | 1 | 0 | 0 | 5 |

(Note)
Test conditions: dipping at 25° C. for 7 days.

TABLE 2

| | Volume change ΔV (%) | | | | |
|---|---|---|---|---|---|
| | Example 1 | Example 2 | Example 3 | Example 4 | Comparative Example* |
| Toluene | 16 | 32 | 17 | 15 | 22 |
| n-heptane | 14 | 19 | 15 | 15 | 11 |
| Methyl isobutyl ketone | 36 | 45 | 35 | 35 | 260 |

(Note)
Test conditions: dipping at 25° C. for 3 days.
*Comparative Example: values obtained by measured the composition (iii) shown in U.S. Pat. No. 4,100,136.

TABLE 3

| | Contact angle (degree) | |
|---|---|---|
| Rubber | Pure water | Lubricating oil*[1] |
| Example 1 | 110 | 53 |
| Example 2 | 108 | 45 |
| Example 3 | 110 | 52 |
| Example 4 | 110 | 54 |
| Comparative Example*[2] | 98 | 38 |

(Note)
*[1]Lubricating oil: ASTM No. 3 oil
*[2]The values of Comparative Examples were obtained by measuring the composition (iii) shown in U.S. Pat. No. 4,100,136.

EXAMPLE 5

12 parts by weight of fumed silica filler treated with trimethylsiloxy groups was added to 100 parts of the fluorocarbonsiloxane polymer used in Example 1, then after they were mixed by a three-roll mill, 3.6 parts by weight of a fluorine-containing organohydrogensiloxane represented by the following formula:

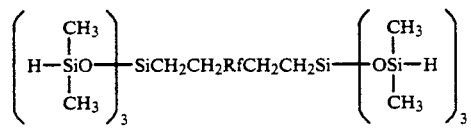

wherein Rf represents

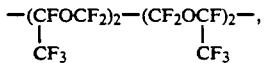

0.47 parts by weight of carbon black, a toluene solution of a catalyst obtained by modifying chloroplatinic acid with CH$_2$=CH—Si(CH$_3$)$_2$—O—Si(CH$_3$)$_2$—CH=CH$_2$ (the concentration of platinum: 1.0 wt. %), and 0.002 part by weight of 2-ethynylisopropanol were added thereto, followed by mixing. The resulting mixture was deaerated under reduced pressure, was then placed in a rectangular clamping frame, was deaerated again, and was press cured at 120 kgf/cm$^2$ and 150° C. for 20 min. Test specimens were cut out from the cured sample and the physical properties were measured in accordance with JIS K 6301, which gave the following results:

| | |
|---|---|
| Hardness (JIS-A*): | 45 |
| Elongation (%): | 290 |
| Tensile strength (kgf/cm$^2$): | 45 |

EXAMPLE 6

Example 5 was repeated, except that as the fluorocarbonsiloxane polymer, 100 parts of a fluorocarbonsiloxane polymer (having a viscosity of 6,500 cSt, an average molecular wieght of 3,100, and a vinyl group content of 0.007 mol/100 g) represented by the following formula:

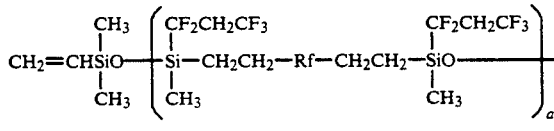

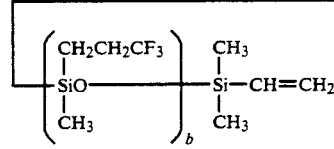

wherein Rf represents

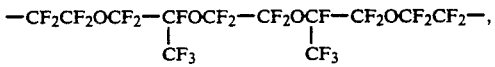

a is about 36 on average, c is about 4 on average, and the constitutional units are arranged at random was used, and as the fluorine-containing hydrogensiloxane, 5.1 parts by weight of a fluorine-containing hydrogensiloxane represented by the following formula:

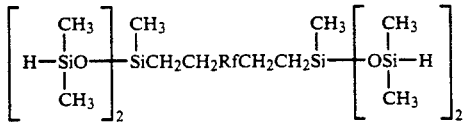

wherein Rf represents $$-(CF_2CF_2OCF_2)(CFOCF_2)(CF_2OCF)(CF_2OCF_2CF_2)-$$
$$\quad\quad\quad\quad\quad\quad | \quad\quad\quad\quad | $$
$$\quad\quad\quad\quad\quad\quad CF_3 \quad\quad\quad CF_3$$

was used, thereby preparing a composition, which in turn was formed into a cured sheet. Test specimens were cut out from the cured sheet and the physical properties were measured in accordance with JIS K 6301, which gave the following results:

| | |
|---|---|
| Hardness (JIS-A*): | 50 |
| Elongation (%): | 310 |
| Tensile strength (kgf/cm$^2$): | 47 |

EXAMPLE 7

Example 5 was repeated, except that as the fluorocarbonsiloxane polymer, 100 parts of a fluorocarbonsiloxane polymer (having a viscosity of 5,900 cSt, and a vinyl group content of 0.008 mol/100 g) represented by the following formula:

$$CH_2=CHSiO\left[\begin{array}{c}CH_3\\|\\Si-CH_2CH_2-Rf-CH_2CH_2-SiO\\|\\CH_3\end{array}\right]_a$$

$$\left[\begin{array}{c}CH_3\\|\\Si-CH_2CH_2-C_6F_{12}-CH_2CH_2-SiO\\|\\CH_3\end{array}\right]\left[\begin{array}{c}CH_3\\|\\Si-CH=CH_2\\|\\CH_3\end{array}\right]_b$$

wherein Rf represents $$-\left[\begin{array}{c}CFOCF_2\\|\\CF_3\end{array}\right]_3-\left[\begin{array}{c}CF_2OCF\\|\\CF_3\end{array}\right]_3-,$$

a is about 21 on average, c is about 9 on average, and the constitutional units are arranged at random was used, thereby preparing a cured sheet. Test specimens were cut out from the cured sheet and the physical properties were measured in accordance with JIS K 6301.

| | |
|---|---|
| Hardness (JIS-A*): | 59 |
| Elongation (%): | 250 |
| Tensile strength (kgf/cm$^2$): | 60 |

Then similarly to Examples 1 to 4, the chemical resistance, the solvent resistance, and the surface properties were determined. The results are shown in Tables 4 to 6 below.

TABLE 4

| | Volume change ΔV (%) | | | |
|---|---|---|---|---|
| | Example 5 | Example 6 | Example 7 | Silicone rubber |
| 10% aqueous NaOH solution | 0 | 0 | 0 | 0 |
| 10% aqueous HCl solution | 0 | 0 | 0 | 2 |
| 10% aqueous HNO$_3$ solution | 0 | 0 | 0 | 8 |

TABLE 4-continued

| | Volume change ΔV (%) | | | |
|---|---|---|---|---|
| | Example 5 | Example 6 | Example 7 | Silicone rubber |
| 10% aqueous H$_2$SO$_4$ solution | 0 | 1 | 0 | 5 |

(Note)
Test conditions: dipping at 25° C. for 7 days.

TABLE 5

| | Volume change ΔV (%) | | | |
|---|---|---|---|---|
| | Example 5 | Example 6 | Example 7 | Comparative Example* |
| Toluene | 8 | 7 | 9 | 15 |
| n-heptane | 11 | 10 | 11 | 11 |
| Methyl isobutyl ketone | 30 | 42 | 33 | 260 |

(Note)
Test conditions: dipping at 25° C. for 3 days.
*Comparative Example: values obtained by measured the composition (iii) shown in U.S. Pat. No. 4,100,136.

TABLE 6

| | Contact angle (degree) | |
|---|---|---|
| Rubber | Pure water | Lubricating oil*$^1$ |
| Example 5 | 112 | 54 |
| Example 6 | 110 | 52 |
| Example 7 | 113 | 58 |
| Comparative Example*$^2$ | 98 | 38 |

(Note)
*$^1$Lubricating oil: ASTM No. 3 oil
*$^2$The values of Comparative Examples were obtained by measuring the composition (iii) shown in U.S. Pat. No. 4,100,136.

EXAMPLE 8

Example 5 was repeated, except that the amount of the fluorine-containing organohydrogensiloxane was changed to 1.8 parts by weight and 1.8 parts by weight of an epoxy group containing siloxane represented by the following formula:

$$H-SiO\left[\begin{array}{c}CH_3\\|\\SiO\\|\\CH_3\end{array}\right]_3-SiCH_2CH_2RfCH_2CH_2Si-$$

$$\left[\begin{array}{c}CH_3\\|\\OSi-H\\|\\CH_3\end{array}\right]_2\left[\begin{array}{c}CH_3\\|\\O-SiCH_2CH_2CH_2OCH_2CHCH_2\\|\quad\quad\quad\quad\quad\quad\quad\quad\quad\backslash/\\CH_3\quad\quad\quad\quad\quad\quad\quad\quad\quad O\end{array}\right]$$

wherein Rf represents $$-\left[\begin{array}{c}CFOCF_2\\|\\CF_3\end{array}\right]_2-\left[\begin{array}{c}CF_2OCF\\|\\CF_3\end{array}\right]_2-$$

was used, thereby preparing a curable composition.

The composition was pressed for 20 min under conditions of 120° C. and 120 kg/cm$^2$ into a sheet having a thickness of 2 mm, then from this sheet a sample for the measurement of the adhesive strength under shear shown in FIG. 1 was formed, and the adhesive strength under shear to glass, aluminum, iron, and epoxy resin was determined. The results are shown in Table 7.

For the sake of comparison, using the composition of Example 5, the same measurement as above was carried out, and the results are shown in Table 7.

In FIG. 1, reference numeral 1 indicates an adherend such as glass, reference numeral 2 indicates a sealing material formed from the sheet for which the measurement is carried out, reference numeral 3 indicates a spacer, and reference numeral 4 indicates a weight.

TABLE 7

| | Example 8 | | Comparative Example (Example 5) | |
|---|---|---|---|---|
| Adherend | Adhesive strength under shear in kgf/cm² | Cohesive failure ratio in % | Adhesive strength under shear in kgf/cm² | Cohesive failure ratio in % |
| Glass | 12.0 | 100 | 3.2 | 0 |
| Aluminum | 9.5 | 100 | 2.1 | 0 |
| Iron | 13.2 | 100 | 3.3 | 0 |
| Epoxy resin | 11.0 | 100 | 2.8 | 0 |

EXAMPLE 9

Example 8 was repeated, except that as the fluorocarbonsiloxane polymer, a fluorocarbonsiloxane polymer (having a viscosity of 8,200 cSt and a vinyl group content of 0.007 mol/100 g) represented by the following formula:

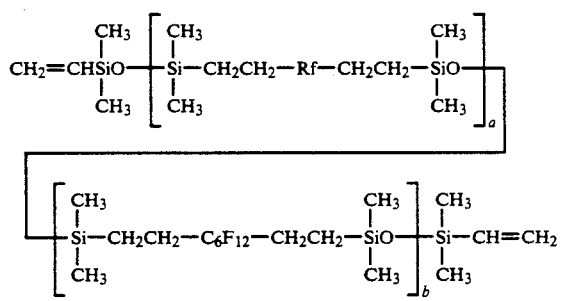

wherein Rf represents

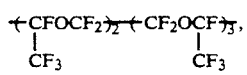

a is about 25 on average, and b is about 3 on average was used, thereby preparing a curable composition, whose adhesion strength under shear was measured.

The results are shown in Table 8.

EXAMPLE 10

Example 8 was repeated, except that, in place of the epoxy group containing siloxane used in Example 8, a compound represented by the following formula:

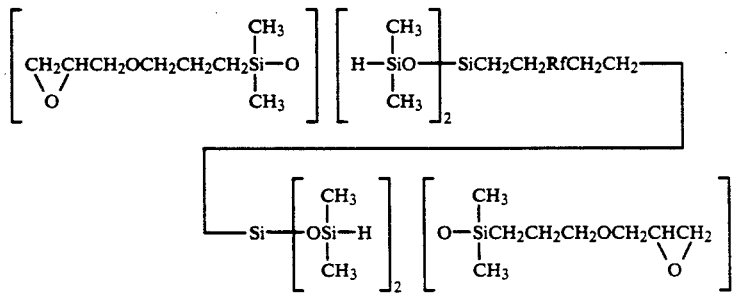

wherein Rf represents

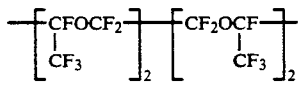

was used, thereby preparing a composition, whose adhesion strength under shear was measured.

The results are shown in Table 8.

TABLE 8

| | Example 9 | | Example 10 | |
|---|---|---|---|---|
| Adherend | Adhesive strength under shear in kgf/cm² | Cohesive failure ratio in % | Adhesive strength under shear in kgf/cm² | Cohesive failure ratio in % |
| Glass | 11.5 | 100 | 10.5 | 100 |
| Aluminum | 10.2 | 100 | 10.6 | 100 |
| Iron | 12.3 | 100 | 11.8 | 100 |
| Epoxy resin | 10.8 | 100 | 10.9 | 100 |

We claim:
1. A curable silicone composition, comprising
(A) a fluorocarbonsiloxane represented by the following general formula (1):

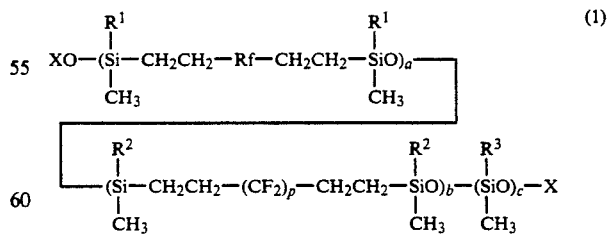

wherein $R^1$ and $R^2$ each represent an unsubstituted or substituted monovalent hydrocarbon group, $R^3$ represents a monovalent hydrocarbon group having 1 to 8 carbon atoms, Rf represents a bivalent group represented by the following general formula:

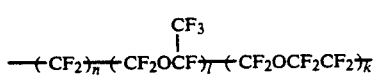

wherein n is an integer of 0 to 8, m and l are each an integer of 0 to 5, and j and k are each an integer of 0 or 1, provided that $l+m+n+j+k$ is an integer bringing the number of carbon atoms to 11 to 30, a is an integer of 2 to 300, b is an integer of 0 to 300, c is an integer of 0 to 5,000, p is an integer of 2 to 8, and X is a triorganosilyl group represented by the following formula:

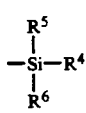

wherein $R^4$ is an unsubstituted or substituted monovalent hydrocarbon group having an aliphatic unsaturated bond, and $R^5$ and $R^6$ each represent a monovalent hydrocarbon group having 1 to 8 carbon atoms, (B) an organohydrogensiloxane containing two or more Si—H groups in the molecule, and (C) a platinum family metal catalyst, the amount of the component (B) being such that the amount of the Si—H groups is 0.5 to 5.0 mol per mol of the aliphatic unsaturated group in the composition.

2. A composition as claimed in claim 1, wherein in the general formula (1) representing the component (A), the fluorocarbonsiloxane, Rf is selected from the group consisting of

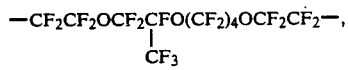

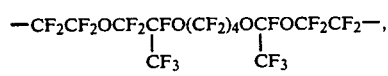

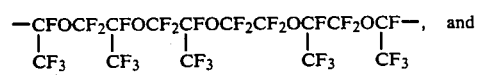, and

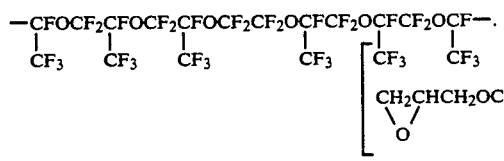

3. A composition as claimed in claim 1, wherein the component (B), the organohydrogensiloxane, is represented by the following formula:

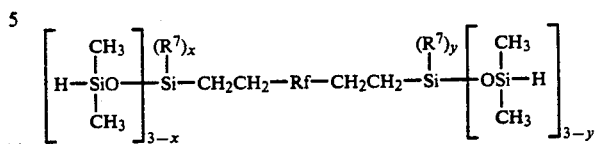

wherein Rf has the same meaning as defined in claim 1, $R^7$ represents a monovalent hydrocarbon group having 1 to 8 carbon atoms, and x and y are each an integer of 0 to 2.

4. A composition as claimed in claim 1, wherein said organohydrogensiloxane comprises at least one compound selected from the group consisting of

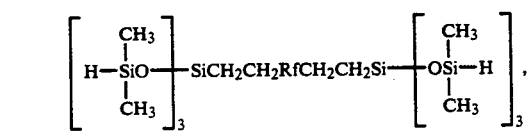,

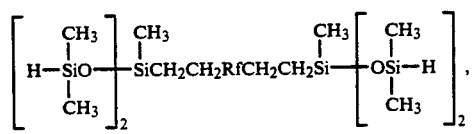,

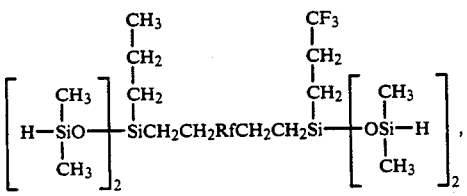, and

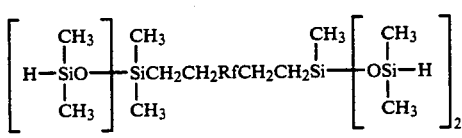.

5. A composition as claimed in claim 1 which, in addition to said components (A) to (C), further comprises an epoxy group containing siloxane represented by the following formula:

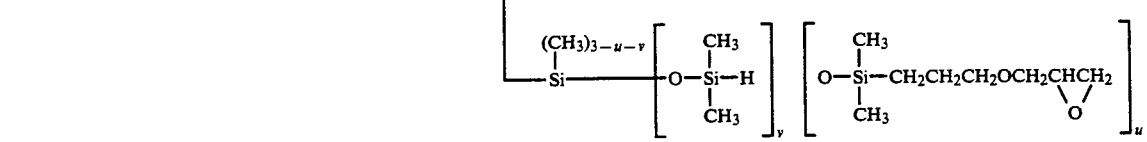

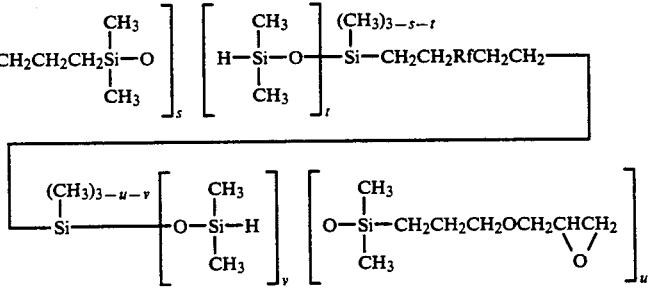

wherein Rf has the same meaning as defined in claim 1 and s and u are each an integer which satisfies that $0 \leq s \leq 3$, $0 \leq u \leq 3$, and $s+u \leq 1$, and t and v are each an integer which satisfies that $1 \leq t \leq 3$ and $1 \leq v \leq 3$.

6. A cured product obtained by curing a composition as claimed in claim 1.

* * * * *

UNITED STATES PATENT AND TRADEMARK OFFICE
CERTIFICATE OF CORRECTION

PATENT NO. : 5,288,829

DATED : February 22, 1994

INVENTOR(S) : Takago et al

It is certified that error appears in the above-identified patent and that said Letters Patent is hereby corrected as shown below:

On the Title Page, item [75], second inventor's name delete "Horishi" Inomata insert --Horoshi-- Inomata.

Signed and Sealed this

Second Day of August, 1994

Attest:

BRUCE LEHMAN

Attesting Officer     Commissioner of Patents and Trademarks

UNITED STATES PATENT AND TRADEMARK OFFICE
CERTIFICATE OF CORRECTION

PATENT NO. : 5,288,829
DATED : February 22, 1994
INVENTOR(S) : Toshio Takago, et al.

It is certified that error appears in the above-indentified patent and that said Letters Patent is hereby corrected as shown below:

On the title page, item (75) Inventors: Delete "Horishi Inomata and insert --Hiroshi Inomata--.

This Certificate supersedes Certificate of Correction issued August 2, 1994.

Signed and Sealed this

Twentieth Day of September, 1994

Attest:

BRUCE LEHMAN

*Attesting Officer*           *Commissioner of Patents and Trademarks*